United States Patent [19]

Ghanbari

[11] Patent Number: 5,280,219

[45] Date of Patent: Jan. 18, 1994

[54] CLUSTER TOOL SOFT ETCH MODULE AND ECR PLASMA GENERATOR THEREFOR

[75] Inventor: Ebrahim Ghanbari, West Nyack, N.Y.

[73] Assignee: Materials Research Corporation, Orangeburg, N.Y.

[21] Appl. No.: 50,726

[22] Filed: Apr. 16, 1993

Related U.S. Application Data

[63] Continuation of Ser. No. 703,452, May 21, 1991, abandoned.

[51] Int. Cl.$^5$ .............................................. H01J 7/24
[52] U.S. Cl. ........................... 315/111.41; 315/111.21; 315/111.81; 313/231.31; 204/298.38; 204/298.37; 204/298.16
[58] Field of Search ............ 315/111.21, 111.41, 315/111.81; 313/231.31; 204/298.38, 298.37, 298.16

[56] References Cited

U.S. PATENT DOCUMENTS

| | | | |
|---|---|---|---|
| 4,265,730 | 5/1981 | Hirose et al. | 204/298 |
| 4,417,178 | 11/1983 | Geller et al. | 315/111.81 |
| 4,580,120 | 4/1986 | Jacquot | 335/301 |
| 4,631,438 | 12/1986 | Jacquot | 313/359.1 |
| 4,638,216 | 1/1987 | Delaunay et al. | 315/111.81 |
| 4,713,585 | 12/1987 | Ohno et al. | 315/111.81 |
| 4,739,169 | 4/1988 | Kurosawa et al. | 250/423 R |
| 4,745,337 | 5/1988 | Pichot et al. | 315/111.41 |
| 4,778,561 | 10/1988 | Ghanbari | 156/643 |
| 4,829,215 | 5/1989 | Kim et al. | 315/111.41 |
| 4,866,346 | 9/1989 | Gaudreau et al. | 315/111.21 |
| 4,877,509 | 10/1989 | Ogawa et al. | 204/298 |
| 4,894,510 | 1/1990 | Nakanishi et al. | 219/121.43 |
| 4,902,931 | 2/1990 | Veltrop et al. | 315/111.41 X |
| 4,902,934 | 2/1990 | Miyamura et al. | 315/111.21 |
| 4,919,783 | 4/1990 | Asamaki et al. | 204/298.16 |
| 4,947,085 | 8/1990 | Nakanishi et al. | 315/111.41 |
| 4,960,073 | 10/1990 | Suzuki et al. | 118/723 |
| 4,970,435 | 11/1990 | Tanaka et al. | 315/111.21 |
| 4,996,077 | 2/1991 | Moslehi et al. | 427/38 |
| 5,053,678 | 10/1991 | Koike et al. | 315/111.41 X |
| 5,081,398 | 11/1992 | Asmussen et al. | 315/111.21 X |

FOREIGN PATENT DOCUMENTS

0286132 10/1988 European Pat. Off.

Primary Examiner—Robert J. Pascal
Assistant Examiner—Reginald A. Ratliff
Attorney, Agent, or Firm—Donald F. Frei; Joseph R. Jordan

[57] ABSTRACT

An electron cyclotron resonance plasma generator is provided in a semiconductor wafer plasma processing apparatus and cluster tool module, particularly for use in soft etching. The generator generates a uniform plasma by rotating a plasma producing resonance supporting magnetic field about the axis of a resonance cavity within the vacuum chamber of a plasma processor. The rotated field preferably is a single-cusp or multicusp field. Gas uniformly flows into and through the cavity from a gas distribution shower. Microwave energy is evenly divided and coupled into the cavity in a $TM_{01}$ mode by a plurality of axially and radially aligned loops.

40 Claims, 3 Drawing Sheets

CLUSTER TOOL SOFT ETCH MODULE AND ECR PLASMA GENERATOR THEREFOR

This application is a continuation of application Ser. No. 07/703,452, filed May 21, 1991, now abandoned.

The present invention relates to the processing of semiconductor wafers, and particularly to the generation of plasmas for coating and etching of wafers therewith. More particularly, the present invention relates to the generation of plasma by electron cyclotron resonance (ECR) and to the plasma processing of wafers by vacuum processes such as soft etching in wafer processing machines such as cluster tools.

BACKGROUND OF THE INVENTION

In the production of semiconductor wafers, many coating and etching processes are commonly performed in a vacuum environment with the use of a plasma. Various methods of producing plasmas result in the production of ions and electrons at various energy levels, with varying degrees of efficiency and with varying degrees of spatial uniformity within a plasma processing chamber.

In processes such as sputter coating of wafers, plasmas are directed onto a target of sputtering material to eject material particles of the sputtered target material from the target for deposition onto a wafer substrate. In sputter etching, a plasma is directed onto the wafer substrate where the ions eject surface material from the wafer. In etching processes, plasmas may be used to selectively remove portions of hard layers of material from the substrate with high energy ion bombardment from plasmas, or may be used for light or "soft" etching to remove, without damaging the wafer surface, only a thin surface layer from the wafer to clean or condition the wafer surface for subsequent processing. Soft etching is better preformed with a lower energy plasma. Other reactive processes such as chemical vapor deposition processes (CVD) may employ plasmas in assisting the chemical process.

In sputter coating or hard sputter etching processes, the plasmas are generally produced locally with electrons emitted from a cathode by negatively charging the target of coating material, in sputter coating processes, or the substrate to be etched. Plasmas used for sputter coating processes are typically of relatively high energy, usually in the range of from 400 to 500 electron volts, while those used for hard sputter etching are typically in the range of from 200 to 300 electron volts. These plasmas tend to be of moderately low densities, usually of about five percent ionization.

In semiconductor wafer processing with plasmas, the distribution of the plasma over the surface of a wafer or target must conform to some desired profile. In soft etching, for example, it is usually preferred that a plasma be directed uniformly over the entire surface of the wafer. In addition, since in soft etching processes it is usually undesirable to remove substantial amounts of material from, or otherwise damage, the substrate, it is desirable that the plasma impinge upon the substrate with low energy, usually of less than 100 electron volts. As a result, the heating effects of the plasma striking the substrate are relatively low, allowing the use of plasmas of higher densities to produce a higher etching rate.

The production of plasmas by some processes, such as by high frequency RF excitation of the gas in the chamber, often results in a plasma in which the ions are at several hundred electron volts. Even when magnetron enhanced, the plasma production efficiency is usually not more than from five to ten percent ionization. On the other hand, production of plasmas with procedures such as electron cyclotron resonance may produce a plasma of from 15 to 35 electron volts and of from 25% to 30% ionization efficiency.

Commonly, ECR generation of plasmas is accomplished at a location remote from the surfaces being treated with the plasma, from which it is then transferred to the processing location, usually in a chamber or region adjacent the region of plasma generation. ECR generated plasmas are frequently produced with microwave energy, often at the available FCC assigned frequency of 2.54 GHz. The microwave energy is introduced into a vacuum cavity that is often cylindrical in shape, and to which a magnetic field is applied by permanent magnets or coils positioned outside of a cylindrical chamber wall. At the 2.54 GHz frequency, resonance of electrons can be achieved in a magnetic field of about 875 gauss.

In many ECR plasma generators, the magnetic fields are generated by electromagnet coils or solenoids wound around the outside of the cylindrical cavity wall to produce in a cavity a magnetic field with lines of force extending axially within the cavity, circling out of the ends of the cavity and around the windings on the outside of the cavity. Within the cavity, magnetic fields so produced are generally symmetrical about the center or axis of the cavity and produce a similarly symmetrical plasma around the axis of the cavity.

Magnetic fields of other shapes are more easily produced with permanent magnets positioned around the outside of the cavity. Examples of such fields are cusp fields, which have field lines extending through the side walls of the cavity. These cusp fields tend to have symmetries about one or more planes that pass through or contain the axis of the cavity and intersect the chamber wall.

With magnets having radially oriented polar axes positioned around a cylindrical cavity, each with the same polar orientation, a single-cusp field is produced. In this single-cusp field, the lines of force diverge from the cylinder wall proximate the centers of the magnet poles along a circle around the cylindrical chamber wall, forming two field portions that are symmetrical at a plane that contains this circle and bisects the axis of the cylinder. From this plane, the lines of magnetic force of the field extend axially out of the ends of the chamber and return to the opposite poles of the magnets outside of the chamber, with the stronger resonance supporting lines of force nearer the plane and the axis of the cavity, producing a pair of adjacent resonance regions on opposite sides of the plane and in which plasmas are generated. The shape of the plasma is generally defined by the cusp formed between the diverging field lines.

With similarly positioned magnets but alternately oriented in polarity, a multicusp field is produced in which the lines of force emerge from alternate and similarly oriented ones of the magnets along longitudinal lines on the cylinder wall proximate the magnet poles, loop in radial plane toward the adjacent and oppositely oriented magnets, and reenter the wall along lines longitudinal lines proximate the poles of these adjacent magnets. Such fields tend to be weak along the axis of the cavity and produce distinct plasmas, symmetric about the planes and concentrated in wedge shaped regions between the planes.

While the permanent magnets configured to produce these fields are simple and compact, the fields that they produce and the distributions of the plasmas generated in them are complex with many non-uniformities.

In magnet configurations suitable for use in plasma generators, the regions of electron cyclotron resonance, and consequently the areas at which the plasma is most abundantly produced, are not distributed within the resonance cavity with perfect uniformity. This is primarily due to practical limitations in the precision to which the magnets are made and mounted and to which the cavity is constructed, and to non-uniformities in the distribution and flow of gas within the chamber. As a result, the prior art has employed various methods to deal with the non-uniform plasma distribution to produce a useful plasma distribution at a space within a processing chamber where the process is to take place. Prior art efforts have been directed toward controlling the flow of the plasma, and its distribution, in the space between the plasma generation region and the processing location. These prior art efforts have resulted in approaches that are undesirable in many ways, being complex, expensive, or less than satisfactory in performance. In cluster tool configurations particularly, where each of the processing chambers is modular, complexity and excess size are disadvantageous.

Accordingly, their is a need for a method and apparatus for the more efficient and uniform production of a plasma for wafer processing, and particularly for a compact and simple plasma generator for such applications.

SUMMARY OF THE INVENTION

It is a primary objective of the present invention to provide for the generation of a uniform plasma in the processing of semiconductor wafers. It is a more particular objective of the present invention to provide for the high efficiency production of plasma for use in semiconductor wafer coating and etching processes, particularly for low energy plasma applications such as soft etching.

It is a particular objective of the present invention to provide a compact and simple plasma processing module, particularly a soft etch module for a wafer processing cluster tool. It is a further objective of the present invention to provide an electron cyclotron resonance, or ECR, plasma generator for semiconductor wafer processing applications that produces a uniform plasma, is compact and lacks structural complexity.

According to the principles of the present invention, there is provided a method and apparatus for generating, by electron cyclotron resonance, a plasma of high uniformity. In accordance with the present invention, an electron cyclotron resonance field is formed in a cavity and microwave energy introduced. The plasma generating field and the generated plasma are then rotated about the axis of the cavity.

In accordance with a preferred embodiment of the present invention, an electron cyclotron resonance generator is provided having a cavity within a vacuum chamber of a plasma processing apparatus. The generator is provided with a plurality of elongated magnets, preferably permanent magnets, preferably equally spaced around the outside of a tubular cavity wall of the chamber. The tubular cavity wall is preferably cylindrical in shape and the polar axes of the magnets are preferably radially oriented. The magnets produce a cusp field in the plasma generation cavity enclosed within the chamber. The assembly of magnets is rotated at a speed of, for example, 1000 rpm around the centerline of the cavity, rotating the plasma generating magnetic field, the plasma production regions and the plasma, about the centerline of the cavity. An evenly distributed shower of gas is constantly introduced into the generation cavity to enhance the uniformity of the plasma produced.

In one embodiment of the invention, all of the magnets have the same polar orientation, with like poles toward the axis of a cylinder cavity and produce a single-cusp magnetic field. The magnetic lines of force of the single-cusp field extend radially inward from the inner poles of the magnets through the cylindrical wall of the cavity, then diverge and curve in both axial directions through the cavity and out of the ends of the cylinder, circling outwardly and returning to the magnets at their outer ends. The magnets produce a field within the cavity that includes lines of force having a strength sufficient to produce electron cyclotron resonance at the frequency of the microwave energy introduced into the cavity. With microwave energy of 2.54 GHz, this resonance field has a line of force within the cavity of 875 gauss. The plasma produced is generated in two annular field portions spaced axially on opposite sides of a radial plane through the centers of the magnets. These field portions each define a plasma generation region adjacent the plane that lies between them and the axis of the cavity. The regions are adjacent at this plane and tend to form one contiguous plasma.

In another embodiment of the invention, the magnets are alternately oriented with opposite poles of adjacent magnets facing the center of the cylindrical wall of the cavity, producing a multicusp field with the lines of force within the cavity that emerge from the inner ends of alternate ones of the magnets, extending radially inward and then diverging and looping in planes perpendicular to the axis of the cylinder, returning to the wall and through the wall to the opposite inwardly facing poles of two adjacent magnets. The resultant field tends to be weak along the centerline or axis of the cavity. The magnets of this embodiment produce a plurality of arched field lines, each with one at an electron cyclotron resonance supporting strength of approximately 875 gauss, causing the formation of plasma with the 2.54 GHz microwave energy in a plurality of distinct arch shaped plasma generating regions around the axis of the cavity that extend longitudinally inside of the cylindrical cavity wall, parallel to the axis of the cavity.

In the preferred embodiment of the invention, microwave energy is supplied to the cavity through a transmission line that includes a coaxial cable that connects through a power splitter, which divides the microwave energy equally among a plurality of coaxial cables connected each to a coupling loop within the cavity. The coupling loops are equally spaced either around the rim of the inside of the downwardly facing top circular wall of the cavity or around the inside of the cylindrical cavity wall. The loops extend in radial planes that pass through the axis of the cylinder and are spaced at equal angular intervals around the cavity.

Inert gas is continuously introduced into the chamber through a shower, or circular plate with concentric rings of holes therein, at the top end of the cavity. The gas introduced through the shower is distributed uniformly over the top end of the cavity and flows constantly downward through the cavity. The cavity is mounted to the top of a processing chamber, which is, in the described embodiment, a soft etch chamber, with an upwardly facing substrate positioned below the bottom open end of the cavity. The substrate to be processed by the plasma is preferably centered on the axis of the cylinder immediately below the plasma generator. The gas shower cooperates with the distribution of the plasma producing regions within the cavity to replenish spent gas, providing at these regions a uniform supply of gas to fuel the plasma generation process.

The rotation of the electron cyclotron resonance supporting magnetic field rotates the arch shaped plasma generation regions so as to produce, notwithstanding any circular asymmetry in the fields, a plasma that is uniform at all angles about the central axis. The plasma so produced then moves with similar uniformity to the lower end of the generating cavity and onto the substrate. The plasma produced is highly efficient, with approximately 30% ionization, and is of low energy, with the ions produced generally at less than 20 electron volts positive with respect to the substrate. The substrate may also be biased to up to 100 negative volts to aid in the acceleration of the plasma ions toward the substrate. Such a plasma does little damage to the substrate surface and is thereby suitable for use in a soft etching process, while effectively and uniformly etching the surface.

The coupling of the power divided microwave energy into the cavity with plural spaced coupling loops that lie in radial planes of the cylinder produces $TM_{01}$ mode radiation within the cavity. Preferably, the length of the cavity is such that $TM_{011}$ mode energy results in the cavity. As such, the generator is very compact.

These and other objectives of the present invention will be more readily apparent from the following detailed description of the drawings in which:

DETAILED DESCRIPTION OF THE DRAWINGS

Figure 1:
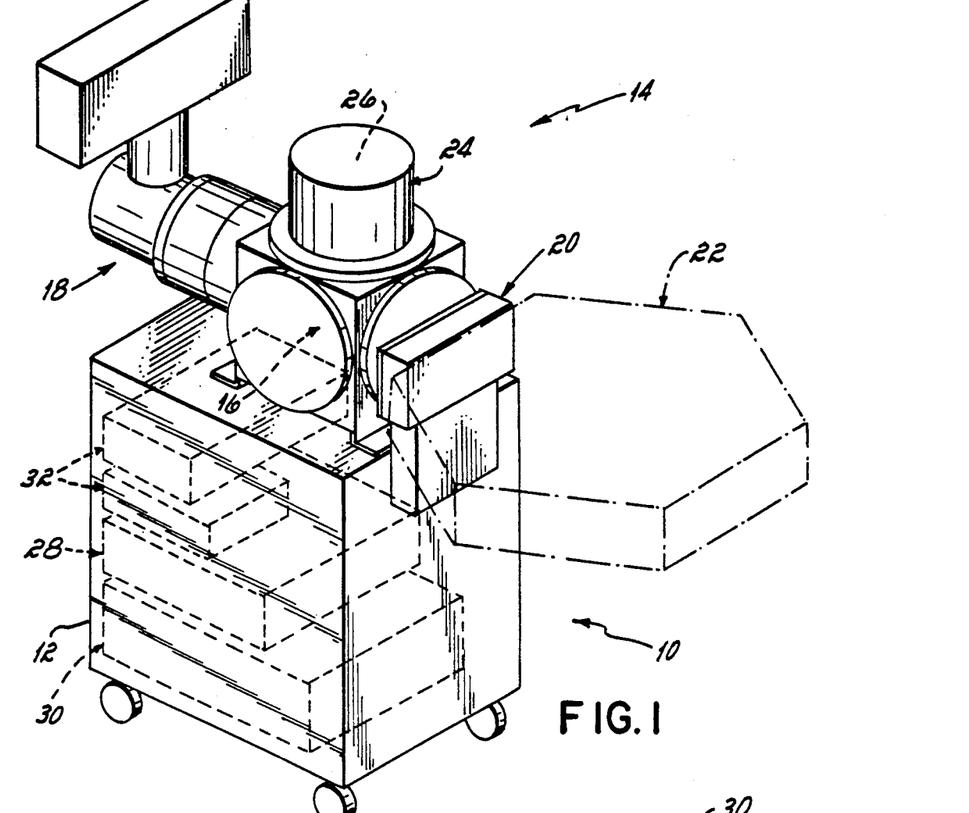
FIG. 1 is an isometric diagram of a soft etch cluster module embodying principles of the present invention.

Referring to FIG. 1, a cluster tool soft etch module 10 according to principles of the present invention is diagrammatically illustrated. The soft etch module 10 includes a wheeled cabinet 12 on which is supported a soft etch processor 14 having contained within a soft etch vacuum processing chamber 16 that is maintained, during etching operations, at a high vacuum pressure level of, for example, $10^{-4}$ Torr, with a high vacuum pump. The vacuum processing chamber 16 of the soft etch processor 14 communicates through a MESA standard slit or gate valve 20 with a transport or transfer module 22 of a wafer processing cluster tool. The transfer module 22 is maintained at a moderate vacuum pressure level and is usually occupied by a clean inert gas. Mounted to the top of the processor 14 is an electron cyclotron resonance plasma generator 24 having a plasma generation cavity 26 contained therein that is open at its bottom to the processing chamber 16. An RF power supply 28, a microwave power supply 30 and additional rack mounted controls 32 are housed within the cabinet 12 to support the operation of the processor 14.

Figure 2:
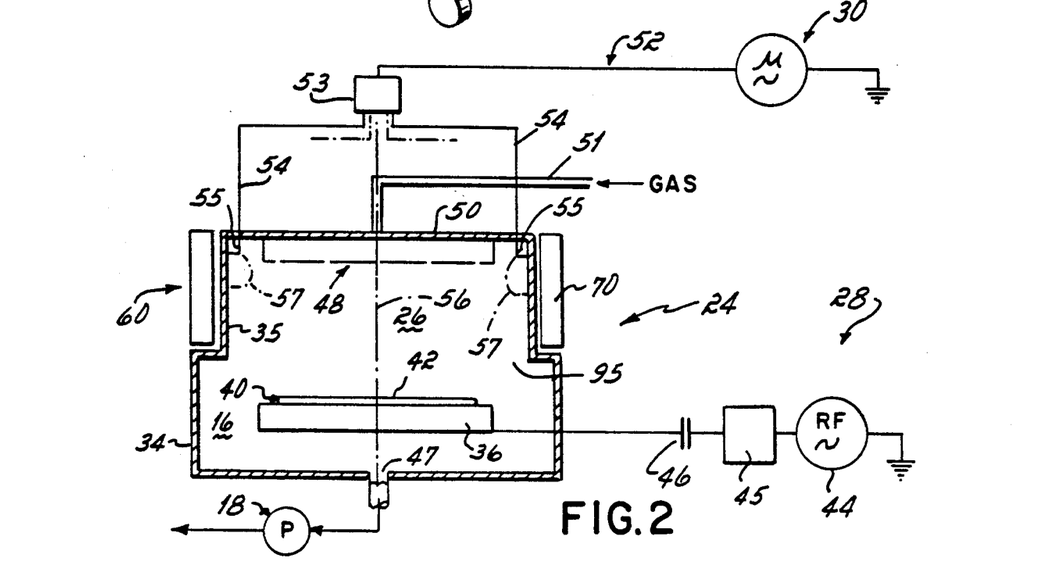
FIG. 2 is a schematic drawing of the plasma generator and processing chamber of the module of FIG. 1.

The processor 14 is illustrated schematically in FIG. 2 having a pressure sealed chamber wall 34 that surrounds the processing chamber 16. The chamber wall 34 is metal, electrically conductive and maintained at a ground potential. The upper portion of the chamber wall 34 includes a cylindrical outer wall 35 that contains within it the plasma generation chamber 26.

In the processing chamber 16 is positioned a fixed wafer support 36, electrically insulated from the chamber wall 34. The support 36 is positioned to align horizontally with the slit opening of the gate valve 20 (FIG. 1), to receive a horizontally disposed wafer 40 from an extendable and rotatable transfer arm (not shown) mounted within the chamber within the transfer module 22. The support may be moveable to move the wafer 40 from the position of alignment with the valve 20 into an optimal position with respect to the plasma generation cavity 26. The wafer 40 is held on the support with its surface to be etched 42 facing upwardly toward the plasma generation cavity 26 at the top of the processing chamber 16.

The RF power supply 28 supplies a bias voltage, if desired, of from 0 to $-100$ volts. The RF power supply 28 includes a 13.56 MHz generator 44 that connects through a matching network 45 and blocking capacitor 46 to the wafer support 36 in the processing chamber 16. The high vacuum pump 18 has an inlet 47 that communicates with the vacuum chamber 16 in the vicinity of the wafer support 36 so that the flow of gas within the chamber 16 flows downwardly from the plasma generation cavity 26. Gas is supplied into the chamber 16 through a gas inlet shower 48 on the inside of a circular end wall 50 that forms the top end of the plasma generation chamber 26 at the top of the plasma generation cavity 26 from a gas supply 51.

Microwave energy at a power level of approximately 1500 watts is supplied from the microwave power supply 30 through a transmission line and coupled into the cavity 26. The transmission line includes a coaxial cable 52 to a power splitter 53, which divides the power equally among a plurality of output coaxial cables 54, preferably eight in number, that feed it to a similar plurality of coupling loops 55. The loops 55 are equally spaced around axis 56 of the cylindrical wall 35 of the generator 24, either around the periphery of the circular upper end 50 of the chamber wall 34, or in on the cylindrical side wall 35 of the generation cavity 26, as indicated by the phantom lines at positions 57. The loops 55 are configured and placed such that they present a impedance, when mounted in the cavity 26, matched to that of the cable 54.

An assembly 60 of permanent magnets is rotatably mounted on the outside of the cylindrical cavity wall 35. The magnets of the assembly 60 are of suitable strength and configuration to produce a magnetic cusp field of having a strength of about 875 gauss within the cavity 26 at some radius from the axis 56 spaced from but generally near the cylindrical cavity wall 35.

Figure 3:
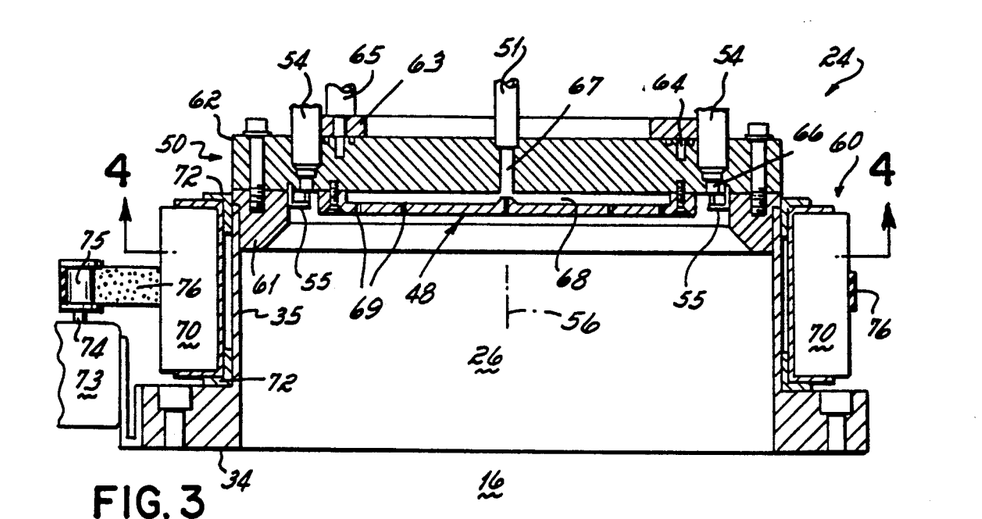
FIG. 3 is a side cross-sectional view through the plasma generator of FIG. 2 illustrating an ECR plasma generator according to an embodiment of the present invention in the module of FIG. 1.

The ECR generator 24 is illustrated in the cross-sectional side view of FIG. 3 containing the plasma generation cavity 26 at the upper end of processing chamber 16. The processing chamber 16 is enclosed within the chamber wall 34, which includes the cylindrical cavity side wall 35 that surrounds the generation cavity 26, and the circular top wall 50 that closes the generation cavity 26 at the top of the chamber 16. The circular top wall 50 is made up of a flange 61, rigidly connected and sealed to the top end of the cylindrical wall 35, to which is bolted and sealed a circular cover 62, which seals the top of the cavity 26 and chamber 16. A cooling ring 63 is mounted on the top of the cover 62 and encloses a cooling channel 64 through which cooling water is circulated from a cooling water supply line 65.

Figure 4:
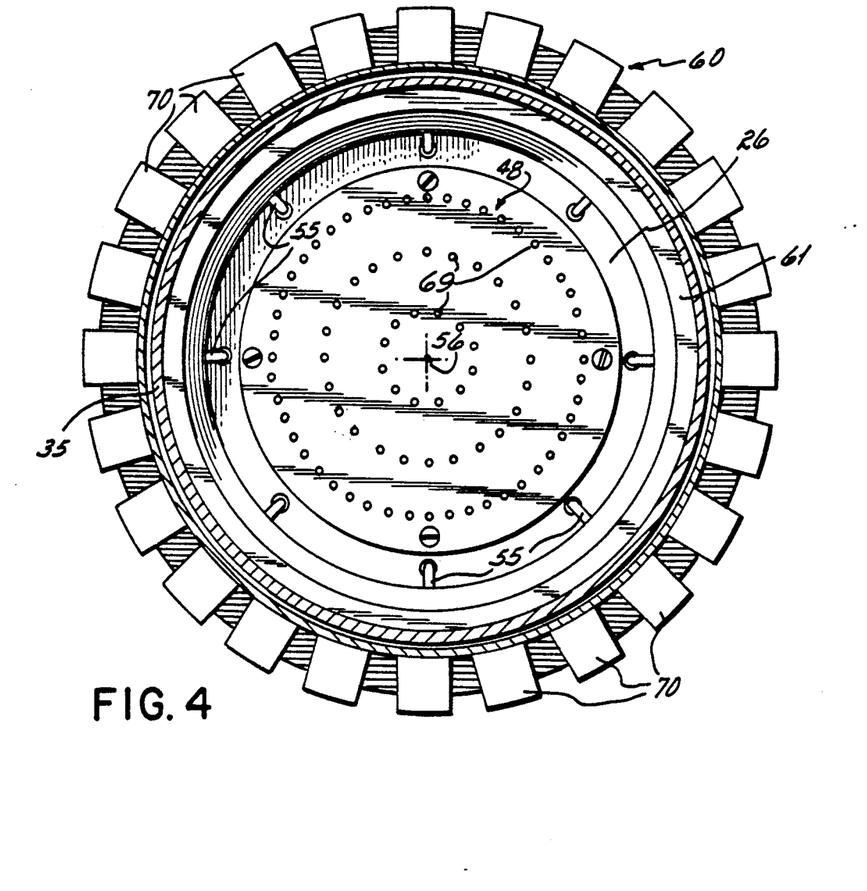
FIG. 4 is an upwardly facing cross-sectional view through the ECR generator along line 4—4 of FIG. 3.

The coaxial cables 54 have output ends physically mounted in a circle on the cover 62 and their outer shield conductors connected to the grounded covers 62. The loops 55 extend from the center conductors of the coaxial cables 54, which are insulated from at the cover 62 from the end plate 50 by insulating bushings 66. As illustrated in FIGS. 3 and 4, the loops 55 connect from the center conductors of the coaxial cables 54 to the grounded chamber wall 34, either on the end plate 50 or at the cylindrical wall 35, extending through space within the cavity 26, each in a different one of a plurality of equally angularly spaced radial planes that each contains the axis 56 of the cavity 26 and cylindrical side wall 35.

The gas inlet line 51 is connected to a gas inlet port 67 in the center of the cover 62 on the axis 56 of the cavity 26. The inlet port 67 communicates with an annular gas distribution space 68 contained between the cover 62 and the gas distribution shower 48. A plurality of gas venting holes 69 are provided through the shower 48 to vent gas into the vacuum chamber 16 at the top of the cavity 26. As illustrated in FIG. 4, the holes 69 are arranged in a pattern of concentric rings, shown as three in number, in which they are equally spaced in three concentric circles of 12, 24 and 48 holes.

The magnet assembly 60 includes a plurality of, preferably, permanent magnets 70. The magnets 70 are bars of strongly magnetic material, and are positioned in the assembly 60 in a cylindrical array, equally spaced around the outside of the cylindrical wall 35 of the cavity 26. Each of the magnets 70 has a polar axis aligned in a radial plane that contains the axis 56 of the cavity 26. The magnet assembly 60 is rotatably mounted on the outside of the cylindrical wall 35 on a pair of bushing collars 72, fixed to the wall 35 and in which the assembly 60 is slidably mounted. In operation, the assembly 60 is rotatably driven around the outside of the cylindrical wall 35 by an electric motor 73, mounted to the outside of the chamber wall 34. The motor 73 has an output drive shaft 74 with a pulley 75 on its outer end, around which extends a drive belt 76 in frictional contact with the pulley 75. The belt 76 extends around and frictionally engages the outside of the assembly 60 to rotate it with the rotation of the motor 73.

Figure 5:
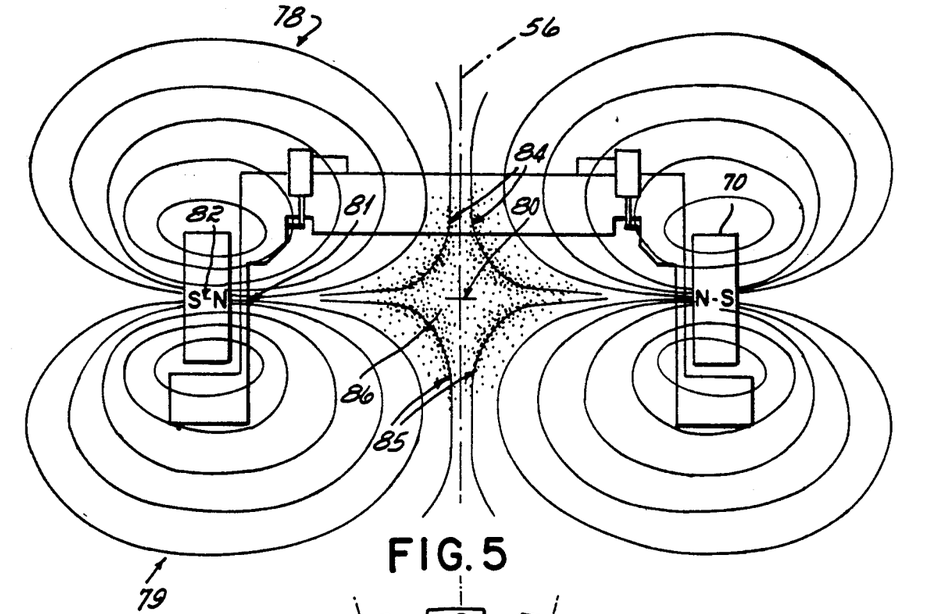
FIG. 5 is a diagram, similar to the cross-sectional view of FIG. 3, illustrating the magnet configuration, magnetic field shape and plasma generation region positions in the single-cusp embodiment of the generator of the present invention.

The magnets 70 of the magnet assembly 60 are preferably provided in pairs of diametrically opposed magnets having similar poles that face each other across the axis 56 of the cavity 26. The relative orientation of the different pairs of the magnets 70 determines the type of cusp field produced. The single-cusp field, illustrated in the diagram of FIG. 5, is produced by orienting the magnet poles of all of the magnets the same, that is, with the same pole of each facing the center or axis 56 of the cavity 26. The multicusp field, illustrated in the diagram of FIG. 6, is produced by orienting the magnet poles of alternate pairs of magnets the same, but the poles of adjacent pairs of the magnets in opposite radial directions.

Referring to FIG. 5, the single-cusp field produced by a magnet array 60 of similarly oriented magnets 70 produce a field in the form of two annular field portions 78, 79 spaced axially in the cavity 26 on opposite sides of, and symmetrical about, a radial plane that intersects the axis 56 of the cavity 26 at a point 80, intersects the wall 35 of the cavity 26 in a circle 81, and bisects the magnets 70 at a plane 82. Each of the two annular field portions 78, 79 has magnetic field lines that increase in strength, from the cylindrical wall 35 of the cavity 26 to the axis 56. Each of the fields or field portions 78, 79 includes a field line, for example lines 84, 85 of the strength to support electron cyclotron resonance, and thus a plasma generation region, in the cavity. Such field lines 84, 85 would represent a field strength of 875 gauss for a microwave excitation frequency of 2.54 Ghz. These lines 84, 85 define between them an electron trap at the center of the cavity 26, adjacent the plane and along the axis 56. The plasmas produced in each field 84, 85 are adjacent the plane and together form a contiguous plasma. As such, a cusp of the fields at the plane defines a plasma 86 formed in the cavity 26 between the diverging field lines near the plane through the center of the magnets and along the axis 56, around the center point 80.

Figure 6:
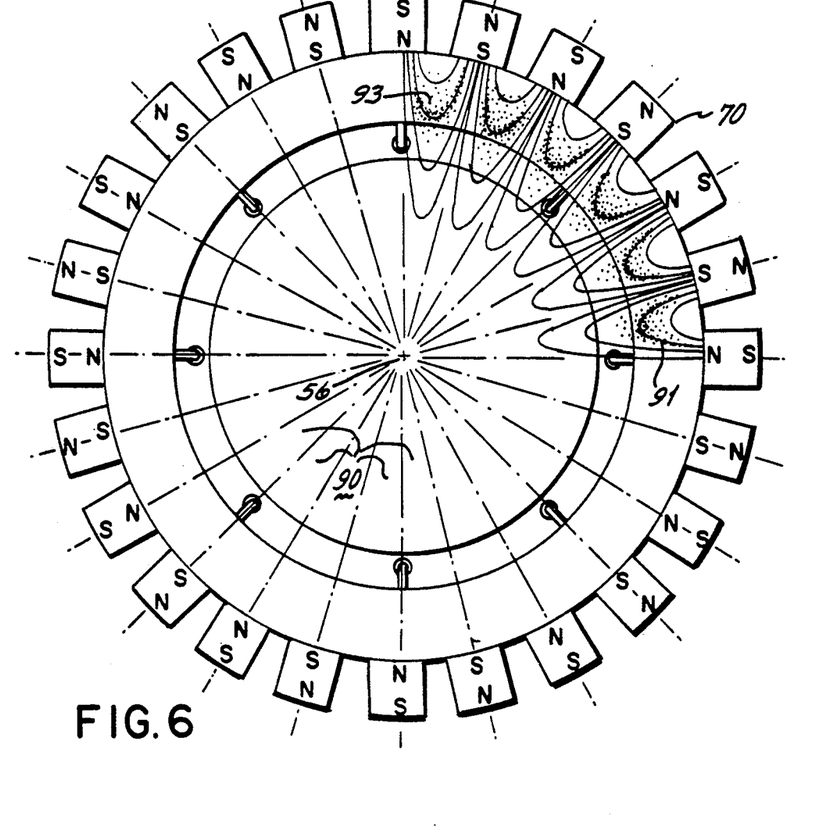
FIG. 6 is a diagram, similar to the cross-sectional view of FIG. 4, illustrating the magnet configuration, magnetic field shape and plasma generation region positions in the multicusp embodiment of the generator of the present invention.

Referring to FIG. 6, the multicusp field produced by a magnet array 60 of alternately oriented magnets 70 produce a field in the form of a plurality of wedges shaped longitudinal regions 90 spaced circumferentially around the inside of the cavity 26, each parallel to axis 56 of the cavity 26. Each of the plurality of longitudinal regions 90 is also characterized by magnetic field lines of decreasing strength, from the cylindrical wall 35 of the cavity 26 to the axis 56. Each of the fields includes a field line, for example line 91, of the strength to support electron cyclotron resonance in the cavity. Such a field line 91 represents, for example, a field strength of 875 gauss for a microwave excitation frequency of 2.54 Ghz. This line forms a magnetic tunnel or electron trap adjacent the inside of and extending longitudinally along the cylindrical cavity wall 35. As such, a plurality of distinct circumferentially spaced longitudinal plasmas 93, equal in number to the number of longitudinal regions 90, is formed parallel to the axis 56 in the cavity 26.

The magnetic cusp fields produced by the magnets 70, and the plasmas generated thereby, lack the symmetry of the axial fields produced by solenoids. In addition, the uniformity of the field shapes produced by each of the magnets is not exact and the concentration of gas molecules, ions and electrons in the plasma generation cavity may vary from point to point. The plasmas produced are spatially located near the cylindrical walls of the generating chamber. These plasmas rotate with the magnet assembly 60 sufficiently fast to produce an average plasma strength or density that is uniform around the axis 56 of the cavity 26 and the chamber 16.

With reference again to FIG. 2, the cavity 26 has an open lower end 95 from which the plasma propagates with uniformity around the axis 56 onto the substrate 40 to uniformly etch the substrate surface 42. The positioning of the substrate 40, for uniform soft etching of the surface 42, may be within the cavity 26, but is preferably at some distance below the cavity 26 in the chamber 16. The ideal spacing will vary depending on the relative dimensions of the cavity 26, the wafer 40 and the characteristics of the microwave energy, such as frequency, the precise strengths, dimensions and positions of the magnets, the properties of the gas in the chamber, and the desired results of the process being performed.

The ECR plasma generator 24 is suitable for plasma processes other than soft etching. The plasma it produces may be used to enhance sputter coating processes, where it will be directed onto a target, and for plasma enhanced chemical vapor deposition or reactive ion etching processes where it will be directed into a reactive gas. It is also useful for selective ion etching, ion beam processing, and other plasma processing applications where it may also be provided with extractors, magnetic pipes or shaping fields, or electrodes to focus or otherwise selectively direct the flow of the ions or plasma onto a surface or into a space for selective processing of areas of a substrate.

Furthermore, it will be appreciated by those skilled in the art that while the present invention is described in the context of certain illustrated and preferred embodiments, that variations of these embodiments may be made without departing from the principles of the present invention. For example, while the permanent magnets 70 of the illustrated embodiments are preferred, electromagnets can be configured to produce the fields illustrated or other fields that can benefit from certain of the concepts of the present invention. Furthermore, while loop coupling is preferred, waveguide to waveguide coupling, and coupling with antenna probes may produce the $TM_{01}$ mode of microwave excitation in the cavity, while other modes of coupling and other modes of excitation can also be used beneficially with certain concepts of the present invention. To most effectively utilize the principles of the present invention, the details of microwave coupling and excitation, and the shapes of the magnetic field and cavity, should be chosen purposefully to achieve the ultimately desired plasma process and with the ultimate distribution of the generated plasma in mind.

Accordingly, what is claimed is:

1. A silicone wafer plasma processing apparatus comprising:
   a sealed chamber containing a gas and having a wafer transferring port in a wall thereof communicating with a vacuum transfer chamber of a wafer transfer module of a wafer processing cluster tool, the port having a valve therein for sealing the sealed chamber from the transfer chamber;
   a high vacuum pump having an inlet communicating with the sealed chamber so as to produce a vacuum pressure level in the gas in the sealed chamber;
   a plasma generation cavity in the sealed chamber;
   a wafer holder to support the wafer with a side thereof facing the cavity;
   a source of microwave energy;
   means for coupling the microwave energy from the source into the cavity;
   a magnet assembly including a plurality of magnets positioned around the cavity, the magnets having a strength and configuration for producing a plurality of magnetic field portions each sufficient in strength to produce electron cyclotron resonance in the cavity to generate a plasma of the gas, the field portions defining regions at which the plasma the plasma is located within the cavity; and,
   means for rotating the assembly, including the magnets, as a unit around the cavity to rotate the field portions, the regions and the plasma therewith within the cavity.

2. The etch apparatus of claim 1 wherein:
   the magnets are configured, positioned and oriented to produce at least one cusp in the magnetic field that defines the location of plasma generation, the rotation of the magnets causing a rotation of the cusp and rotation of the plasma about an approximate centerline of the cavity.

3. The apparatus of claim 2 wherein:
   the magnets are configured, positioned and oriented to produce a single-cusp magnetic field in which the cusp separates two annular longitudinally spaced plasma generation field portions, the rotation of the magnets causing the rotation of the cusp and the rotation of the plasma about the approximate centerline of the cavity.

4. The apparatus of claim 3 wherein:
   the magnets include a plurality of permanent magnets spaced around the outside of the cavity, each with a polar axis that generally intersects the centerline of the cavity, and each oriented with the same pole toward the centerline of the cavity, to produce the single-cusp magnetic field in the cavity.

5. The apparatus of claim 2 wherein:
   the magnets are configured, positioned and oriented to produce a multicusp magnetic field having a plurality of cusps, each separating a plurality of longitudinal axially spaced plasma generation regions, the rotation of the magnets causing rotation of the cusps, rotation of the longitudinal plasma generation regions and rotation of the plasma about the approximate centerline of the cavity.

6. The apparatus of claim 5 wherein:
   the magnets include a plurality of permanent magnets spaced around the outside of a tubular wall of the cavity, each with a polar axis that generally intersects the centerline of the cavity, the orientation of the magnets alternating an even number of times about the centerline of the cavity, to produce the multicusp magnetic field in the cavity.

7. The apparatus of claim 1 wherein:
   the cavity has a closed end having a gas introduction port therein and a plurality of gas inlet holes in fluid communication with the gas introduction port, the holes being distributed in a pattern so as to uniformly introduce gas into the cavity uniformly across the closed end of the cavity.

8. The apparatus of claim 1 wherein:
   a cavity is cylindrical and has an axis constituting the centerline thereof, the magnets rotation means being operative to rotate the magnets about the axis of the cylindrical cavity, the wafer holder being positioned so as to center the wafer held thereby on the axis.

9. The apparatus of claim 8 wherein:
   the source includes a transmission line connected to the cavity; and the coupling means includes a plurality of loops, each electrically connected to the transmission line so as to couple equal amounts of microwave energy into the cavity, the loops being spaced around the axis of the cavity, the loops being shaped and oriented to produce a $TM_{01}$ mode of excitation by the microwave energy in the cavity.

10. The apparatus of claim 9 wherein:
the cavity is shaped and dimensioned such that the microwave energy, when coupled into the sealed chamber, forms a $TM_{011}$ mode of excitation in the cavity.

11. A silicone wafer plasma processing apparatus comprising:
 a sealed chamber;
 means for supplying gas to the chamber;
 vacuum pump means for reducing the gas within the chamber to a vacuum pressure level;
 a plasma generation cavity in the chamber;
 a wafer holder mounted in the chamber for supporting thereon a wafer to be processed;
 a source of microwave energy coupled into the cavity;
 rotatable magnet means positioned around the cavity, the magnet means including a rotatable assembly of a plurality of magnets, the rotatable assembly having magnets of a strength and configuration for producing a magnetic field within the cavity having a sufficient strength to produce electron cyclotron resonance at regions within the cavity to thereby produce a plasma in the regions; and,
 means for rotating the entire assembly and magnets thereof as a unit around the cavity to rotate the fields, the regions at which the electron cyclotron resonance is produced and the plasma in the regions within the cavity.

12. The wafer processing apparatus of claim 11 wherein:
the magnets are configured, positioned and oriented to produce at least one cusp in the magnetic field that defines the location of the regions in which the electron cyclotron resonance is produced, the rotation of the magnets causing a rotation of the cusp, the rotation of the regions and rotation of the plasma about an approximate centerline of the cavity.

13. The apparatus of claim 12 wherein:
the magnets are configured, positioned and oriented to produce a single-cusp magnetic field in which the cusp separates two annular longitudinally spaced plasma generation field portions, the rotation of the magnets causing the rotation of the cusp and the rotation of the plasma about the approximate centerline of the cavity.

14. The apparatus of claim 13 wherein:
the magnets include a plurality of permanent magnets spaced around the outside of the cavity, each with a polar axis that generally intersects the centerline of the cavity, and each oriented with the same pole toward the centerline of the cavity, to produce the single-cusp magnetic field in the cavity.

15. The apparatus of claim 12 wherein:
the magnets are configured, positioned and oriented to produce a multicusp magnetic field having a plurality of cusps, each separating a plurality of longitudinal axially spaced plasma generation regions, the rotation of the magnets causing rotation of the cusps, rotation of the longitudinal plasma generation regions and rotation of the plasma about the approximate centerline of the cavity.

16. The apparatus of claim 15 wherein:
the magnets include a plurality of permanent magnets spaced around the outside of a tubular wall of the cavity, each with a polar axis that generally intersects the centerline of the cavity, the orientation of the magnets alternating an even number of times about the centerline of the cavity, to produce the multicusp magnetic field in the cavity.

17. The apparatus of claim 11 wherein:
the cavity has means at one end thereof for introducing an axial flow of gas into the cavity uniformly distributed therein.

18. The apparatus of claim 11 wherein:
the cavity is cylindrical and has an axis constituting a centerline thereof, the magnets rotation means being operative to rotate the magnets about the axis of the cylindrical cavity, the wafer holder being positioned to center the wafer on the axis.

19. The apparatus of claim 18 further comprising:
coupling means for coupling microwave energy from the source into the cavity, including a plurality of loops, each electrically connected between the source and the cavity so as to couple equal amounts of microwave energy into the cavity, the loops being spaced around the centerline of the cavity, the loops being shaped and oriented to produce a $TM_{01}$ mode of excitation by the microwave energy in the cavity.

20. A plasma generator for a semiconductor wafer plasma processor comprising:
 a vacuum chamber having a tubular side wall, a gas introduction port, a gas evacuation port, and a plasma generating cavity surrounded in part by the tubular wall thereof;
 a microwave energy source having an output connected to thereto;
 means for coupling from the output into the cavity microwave energy from the source;
 a rotatable assembly including a plurality of magnets spaced outside of the tubular wall of the cavity and rotatably mounted with respect thereto, the magnets being oriented and configured to generate a magnetic field within the cavity, the magnetic field being of sufficient strength and configuration to produce electron cyclotron resonance within the cavity in a plurality of distinct plasma generation regions where the plasma is produced, the field having magnetic lines of force defining the shape and location of the regions; and,
 means for rotating the assembly, including the magnets as a unit to rotate the magnetic field, the regions and the plasma about an approximate centerline of the cavity.

21. The plasma generator of claim 20 wherein:
the magnets are configured, positioned and oriented to produce at least one cusp in the magnetic field that defines the position of the plasma generation regions, the rotation of the magnets causing rotation of the cusp, rotation of the plasma generation regions and rotation of the plasma about the approximate centerline of the cavity.

22. The plasma generator of claim 20 wherein:
the magnets are configured, positioned and oriented to produce a single-cusp magnetic field in which the cusp separates two annular plasma generation portions longitudinally spaced from each other and extending around the centerline of the cavity, the rotation of the magnets causing a rotation of the cusp and rotation of the plasma generation regions about the approximate centerline of the cavity.

23. The plasma generator of claim 22 wherein:

the magnets include a plurality of permanent magnets spaced around the outside of the tubular wall of the cavity, each with a polar axis that generally intersects the centerline of the cavity, and each oriented with the same pole toward the centerline of the cavity to produce the single-cusp magnetic field.

24. The plasma generator of claim 21 wherein:

the magnets are configured, positioned and oriented to produce a multicusp magnetic field having a plurality of cusps in an array around the centerline of the cavity, each cusp separating two adjacent circumferentially spaced plasma generation regions, the rotation of the magnets causing rotation of the cusps, rotation of the plasma generation regions and the rotation of the plasma about the approximate centerline of the cavity.

25. The plasma generator of claim 24 wherein:

the magnets include a plurality of permanent magnets spaced around the outside of the cavity, each with a polar axis that generally intersects the centerline of the cavity, the orientation of the magnets alternating an even number of times about the centerline of the cavity to produce the multicusp magnetic field.

26. The plasma generator of claim 20 wherein:

the cavity has a closed end having the gas introduction port therein and a plurality of gas inlet holes therein distributed in a pattern about the approximate centerline of the cavity, the holes being in fluid communication with the gas introduction port, the cavity having an opening axially spaced from the closed end opposite the plasma generation regions, the cavity communicating with the gas evacuation port through the opening.

27. The plasma generator of claim 20 wherein:

the cavity is cylindrical and has an axis constituting the centerline of the cavity, the magnets rotation means being operative to rotate the magnets about the axis.

28. The plasma generator of claim 27 wherein:

the coupling means includes a plurality of loops, each electrically connected to the wall and spaced around the approximate centerline of the cavity, the loops being shaped and oriented to produce a $TM_{01}$ mode of excitation by the microwave energy in the cavity.

29. The plasma generator of claim 28 wherein:

the cavity is shaped and dimensioned such that the microwave energy, when coupled into the chamber, forms a $TM_{011}$ mode of excitation in the cavity.

30. The plasma generator of claim 28 wherein:

the transmission line has a power splitter connected therein to divide the microwave energy approximately equally among the loops.

31. The plasma generator of claim 28 wherein:

each of the loops lies in a different one of a plurality of radial planes each passing through and containing the axis of the cavity.

32. A method of plasma processing semiconductor wafers comprising the steps of:

supplying a gas at a vacuum pressure level within a chamber;

coupling microwave energy into a cavity within the chamber;

producing a magnetic field within the cavity with magnets located outside of the chamber;

producing, with the microwave energy and the magnetic field, electron cyclotron resonance in the gas at regions within the cavity;

generating a plasma at the regions within the cavity;

rotating the entire magnetic field with which the electron cyclotron resonance is produced, and thereby the regions and the plasma, about an axis of the cavity; and, processing with the rotated plasma a wafer positioned in the chamber.

33. The method of claim 32 wherein:

the magnetic field producing step includes the step of producing at least one magnetic cusp within the chamber; and the field rotating step includes the step of rotating the magnetic cusp.

34. The method of claim 33 wherein:

the magnetic cusp producing step includes the step of producing a single magnetic cusp located in a plane through the cavity and the axis of the cavity.

35. The method of claim 33 wherein:

the magnetic cusp producing step includes the step of producing a plurality of magnetic cusps located in an array around the axis of the cavity.

36. The method of claim 32 wherein:

the cavity is dimensioned to support $TM_{01}$ mode of the energy within the cavity; and the microwave energy coupling step includes the step of coupling the energy into the cavity in a $TM_{01}$ mode.

37. The method of claim 36 wherein:

the microwave energy coupling step includes the step of coupling the energy into the cavity through at least one loop lying in a plane containing the axis of the cavity.

38. The method of claim 36 wherein:

the microwave energy coupling step includes the step of coupling the energy into the cavity through a plurality of loops circumferentially spaced around the axis of the cavity and each lying in a plane through the axis of the cavity.

39. The method of claim 38 wherein:

the microwave energy coupling step includes the step of equally dividing the microwave energy among the plurality of loops.

40. The method of claim 32 wherein:

the gas supplying step includes the step of introducing a distribution of gas into the cavity uniformly about the axis distributed across the cross-section thereof, and causing the gas to flow parallel to the axis through the cavity in a direction toward and perpendicular to the wafer.

* * * * *